United States Patent [19]
Bridges

[11] Patent Number: 4,715,109
[45] Date of Patent: Dec. 29, 1987

[54] METHOD OF FORMING A HIGH DENSITY VERTICAL STUD TITANIUM SILICIDE FOR REACHUP CONTACT APPLICATIONS

[75] Inventor: Jeffrey M. Bridges, Dallas, Tex.

[73] Assignee: Texas Instruments Incorporated, Dallas, Tex.

[21] Appl. No.: 744,163

[22] Filed: Jun. 12, 1985

[51] Int. Cl.[4] .......................................... H01L 21/28
[52] U.S. Cl. ................................. 437/200; 29/589; 29/591; 357/67; 156/643; 156/653
[58] Field of Search ................. 29/590, 591, 589, 578, 29/580; 148/DIG. 147, DIG. 122; 357/67; 156/643, 659.1, 652, 653

[56] References Cited

U.S. PATENT DOCUMENTS

| | | | |
|---|---|---|---|
| 3,801,880 | 4/1974 | Harada et al. | 427/96 X |
| 4,392,298 | 7/1983 | Barker et al. | 29/577 C |
| 4,410,622 | 10/1983 | Dalal et al. | 156/659.1 X |
| 4,428,796 | 1/1984 | Milgram | 156/637 |
| 4,451,169 | 9/1985 | Bartush | 29/591 |
| 4,451,971 | 6/1984 | Milgram | 29/578 |
| 4,470,874 | 9/1984 | Bartush et al. | 156/643 |
| 4,520,041 | 5/1985 | Aoyama et al. | 427/88 |
| 4,532,002 | 7/1985 | White | 156/643 |
| 4,541,168 | 9/1985 | Galie et al. | 29/579 |
| 4,545,852 | 10/1985 | Barton | 156/643 |

FOREIGN PATENT DOCUMENTS 0079451  6/1981  Japan ...................................... 29/589

OTHER PUBLICATIONS

J. R. Kitcher, "Integral Stud for Multilevel Metal" in *IBM Tech. Disc. Bull.*, vol. 23, No. 4, Sep. 1980, p. 1395.
T. A. Bartush, "Dual Dielectric for Multilevel Metal" in *IBM Tech. Disc. Bull.*, vol. 23, No. 9, Feb. 1981, p. 4140.
J. R. Kitcher, "Reactive Ion Etch Process for Metal Wiring . . . " in *IBM Tech. Disc. Bull.*, vol. 23, No. 4, Sep. 1980, p. 1394.

*Primary Examiner*—Brian E. Hearn
*Assistant Examiner*—T. N. Quach
*Attorney, Agent, or Firm*—Douglas A. Sorensen; Leo N. Heiting; Melvin Sharp

[57] ABSTRACT

The disclosure relates to the formation of reachup contacts for VLSI integrated circuit interconnects wherein studs are formed of a conducting material which reaches up through subsequently applied insulating films or the like to contact metal patterns. The reachup contacts are fabricated using LPCVD polycrystalline silicon as a refill in etched apertures in an insulating layer with a titanium or other appropriate material over the silicon layer with subsequent reaction of the silicon layer and the titanium layer to form temperature resistant studs of titanium silicide.

12 Claims, 8 Drawing Figures

METHOD OF FORMING A HIGH DENSITY VERTICAL STUD TITANIUM SILICIDE FOR REACHUP CONTACT APPLICATIONS

BACKGROUND OF THE INVENTION

1. Field of the Invention

This invention relates to the formation of titanium silicide contacts for VLSI interconnections prior to the formation of insulating layers therearound.

2. Brief Description of the Prior Art

In the formation of very large scale integrated (VLSI) circuits, contact has been made to active layers of the semiconductor material disposed below the surface thereof by the process of etching of holes through insulating layers and the deposition of electrically conductive material into the etched holes or apertures. This procedure has operated very successfully in the prior art circuits wherein the horizontal dimensions of the etched apertures have exceeded the vertical dimensions of such apertures by a substantial amount. Under these prior art conditions, the conductor deposited into the apertures finds no problem passing to the bottom of the apertures and making contact with the active semiconductor or other layers at the bottom of the etched regions. However, with the continual shrinkage in the dimensions of the circuit elements of the integrated circuits, it has been necessary that the apertures utilized for making contact to active and other regions below the surface of the semiconductor device be continually decreased in dimension. While this decrease in dimension has in fact been made for the horizontal dimension, the layer thicknesses have remained substantially the same, thereby requiring that the vertical dimension remain substantially as they have been in the past. The result of this situation is that, as the circuit elements continue to shrink in size, the horizontal dimensions of such apertures as described above gradually approach those of the vertical dimension and may even be exceeded by the vertical dimension. Under these circumstances, it has been found that it is extremely difficult to etch the apertures of required dimension and then proceed to apply conductive material into the aperture which can in fact continually make contact to the active or other region at the bottom of the aperture and extend up to the surface of the device. The result of this problem is apparent and is a falloff in the yield and end product reliability that can be obtained. In view of the above noted problems, it is apparent that new methods for making electrical contact to active or other layers below the surfaces of semiconductor devices must be changed to alleviate the presently existing problem.

SUMMARY OF THE INVENTION

In accordance with the present invention, the above noted problem of the prior art is substantially minimized and there is provided a method whereby contact is made with buried regions prior to the burial thereof by the formation of reachup contacts or studs from the active region with later deposition of insulating material around the upreaching contacts or studs. The upreaching studs are formed using a low pressure chemical vapor depostion (LPCVD) polycrystalline silicon refill and direct reaction thereof with titanium to form titanium disilicide. The studs of titanium disilicide have several significant advantages over studs of aluminum or aluminum silicon in that they can readily withstand moderate temperature processing characteristics of spin on glass densifications, insulator anneals and other planarizing processes. The studs, after formation, are later connected to metal contact patterns in standard manner.

Briefly, in accordance with the present invention the procedure commences utilizing a silicon substrate having an active region therein over which is deposited an oxide layer with a subsequent phosphosilicate glass (PSG) layer deposited over the oxide layer. The area in which the reachup stud is to be formed is then patterned with a photoresist which is deposited over the glass layer and etching then takes place through the glass and oxide layers to expose the silicon substrate at the active region to which contact is to be made. The resist is then removed and polycrystalline silicon is then conformally deposited into the etched hole and over the surface of the glass in an amount sufficient so that the buildup of the polycrystalline silicon from the substrate to its lowest vertical position in the aperture is a greater dimension than the thickness of the polycrystalline silicon layer over the glass layer. The reasons for this requirement will become apparent in the discussin hereinbelow with reference to the drawings.

An oxide layer is then thermally grown on the surface of the polycrystalline silicon sufficient to fill the depression in said layer which exists at the central region of the hole which was previously etched, this depression having been formed due to the extra silicon required to fill the hole as compared with that required to form the layer thereof over the glass. Since the oxidation reaction is diffusion limited, the thickness of the oxide layer will be uniform in a direction perpendicular to the surface of the conformally deposited polysilicon layer. The result will be that the vertical component of the oxide thickness in the depression will be thicker than the vertical component of the oxide thickness over the remaining portions of the polysilicon layer. The newly formed oxide layer is then anisotropically etched to remove this layer from all regions except within the depression, it being apparent that it will require a greater amount of etching to remove all of the oxide from the depression since the oxide layer therein is thicker than over the remaining portion of the polycrystalline silicon. The polycrystalline silicon is then anisotropically etched to remove all of the silicon disposed over the glass layer. Since the oxide does not etch as rapidly as the polycrystalline silicon, the polycrystalline silicon beneath the lowest portion of the depression originally formed will not be etched away, this preventing etching through the polycrystalline silicon material to the silicon substrate therebelow.

The glass layer and remaining oxide over the original depression are then removed in a solution of hydrofluoric acid and titanium is deposited over the entire structure including the original oxide layer and the polycrystalline silicon material which is now extending upwardly above the substrate and oxide layer thereon. The titanium metal is then reacted to form titanium disilicide in the regions wherein it is in contact with the polycrystalline silicon and remains as pure titanium in the regions over the oxide layer. The excess or unreacted titanium is then stripped away to provide the completed upreaching contact. The substrate can be further processed by adding other insulating layers or performing other desired processing steps to complete the circuit. One of the steps will include the contacting of the titanium disilicide with metal conductors to provide the required bus arrangement for the circuit.

DESCRIPTION OF THE PREFERRED EMBODIMENT

Figure 1:
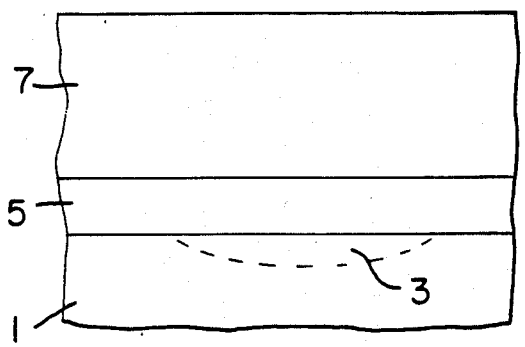
FIGS. 1 through 8 are schematic diagrams showing the results of the various processing steps at various stages in the formation of the VLSI circuit being formed in accordance with the present invention.
Figure 2:
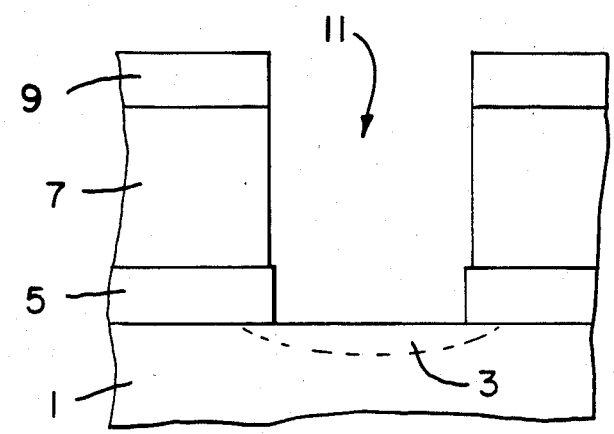

With reference now to the figures, there is shown schematically the formation of a reachup contact in accordance with the present invention. Referring first to FIG. 1, there is shown a portion of a silicon substrate 1 having an active region 3 to which a contact is to be made which will extend to the surface of the final circuit after fabrication thereof. In accordance with the present invention, a reachup contact will be made by first depositing a layer of undoped silicon oxide 5 over the substrate 1 having an active region 3, the layer 5 being about 2000 Angstroms and being formed by plasma enhanced chemical vapor deposition (PECVD) or low pressure chemical vapor deposition (LPCVD). This is a protective layer between the substrate and the heavily doped glass layer to be formed. A layer of phosphosilicate glass (PSG) 7 is then deposited by a typical procedure widely described in the literature in an Atmospheric Pressure Chemical Deposition System over the oxide layer 5, the glass layer being in the range of about 10,000 Angstroms to about 1 micron in thickness, the dimension not being critical. The percentage of phosphorous in this glass is not critical within a 3 to 10 weight percent range because this layer will be removed prior to completion of the circuit. The structure at this point is as shown in FIG. 1. A positive photoresist 9 as shown in FIG. 2 is then formed over the glass layer 7 in standard manner to pattern the regions where the contacts will be formed. The portions of the glass layer 7 and the oxide layer 5 in the unmasked portion are removed using an anisotropic plasma etch, such as $C_3F_8$ with inert diluents, to provide the structure at this point as shown in FIG. 2. The photoresist 9 is then removed using a solution of $H_2SO_4$ and $H_2O_2$ which is known as a piranha solution. It should be noted that the etch rate of the glass is slightly higher than that of the oxide, thereby leaving the small step between the glass layer 7 and the oxide layer 5 as shown in the etched region wherein the aperture has now been formed.

Figure 3:
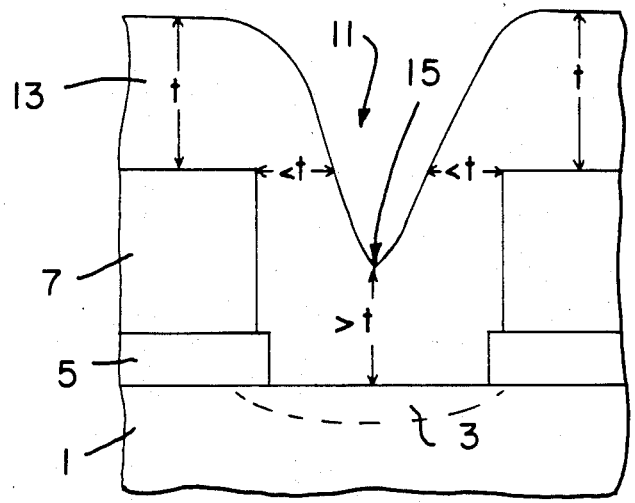

The structure is then cleaned with the piranha solution and deglazed to remove any native oxide buidup for about 60 seconds in a 1% buffered HF solution, the buffer preferably being ammonium fluoride. A polycrystalline silicon layer 13 which is about 850 to 1000 Angstroms thick (though this dimension is determined to provide the result as set forth hereinbelow in this paragraph) is then quickly deposited over the entire structure by LPCVD. As can be seen in FIG. 3, the polycrystalline silicon material 13 forms over the glass layer 7 and also enters into the aperture 11 and coats the sides thereof conformally. The existance of the aperture 11 causes a depression to be formed in the polycrystalline silicon layer 13 as shown. Since the polycrystalline silicon entering the aperture 11 deposits conformally, the build up therein will be greater than on the glass layer 7. Accordingly, the height of the lowest point of the depressed region 15 will be farther above the surface of the substrate 1 than will be the thickness of the polycrystalline silicon layer 13 over the glass 7. This can be seen in FIG. 3 where the distance from the substrate to the point 15 is shown as being greater than (t) whereas the thickness of the layer over the glass 7 is shown as having a thickness (t). It can also be seen that the distance from the sides of the depression to the top surface of the glass 7 will be less than (t) in dimension. It is, of course, understood that the amount of polycrystalline silicon deposition will be such as to provide the structure shown in FIG. 3, the amount of deposition being determined in accordance with the size of the aperture 11 which is formed. In a typical example, the contact geometry was 1.6 microns on the side and the deposited polycrystalline silicon thickness was 90 to 110% of ½ of the contact geometry, this thickness being about 7200 Angstroms and representing the 90% case as shown where the aperture 11 is not completely filled.

Figure 4:
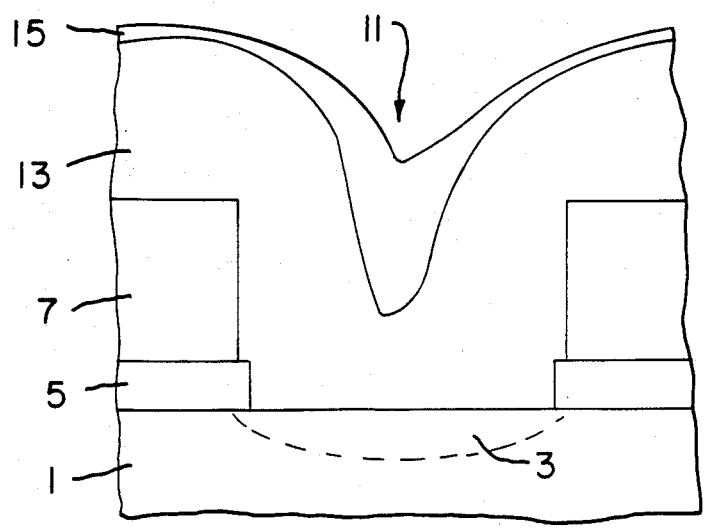
Figure 5:
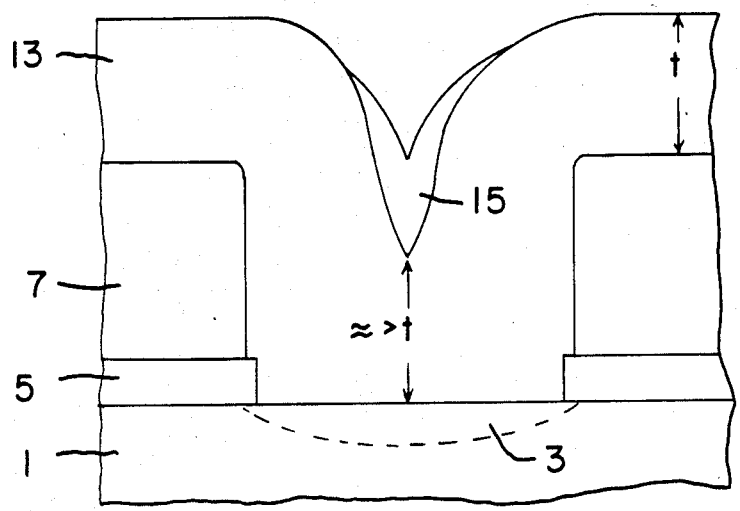

Referring now to FIG. 4, an oxide film 15 is then thermally formed or deposited over the polycrystalline silicon layer 13, the amount of oxide formed in the depression having greater depth than that in the other regions of the device. It is apparent that this situation will occur because the oxide formed in the case of the grown oxide in the depression will gradually grow together at an angle to form the thicker region due to the exagerated angle when viewed directly from above. Also, in the case of a deposited oxide, the oxide grown on the side wall still run together to provide the thicker region as shown in FIG. 4. The oxide layer 15 is then removed in part by using an isotropic plasma etch to etch this layer back until it is completely removed from over the exposed field silicon layer 13. However, as can be seen in FIG. 5, due to the greater thickness of the oxide layer in the region of the depression and the more protected nature of the depression, oxide will be retained in the depression region only as shown at 15. The oxide remaining at 15 will be a protective filling in the cavity which is required henceforth in the process. A preferred etchant for removal of the oxide is $C_3F_8$ plasma.

Figure 6:
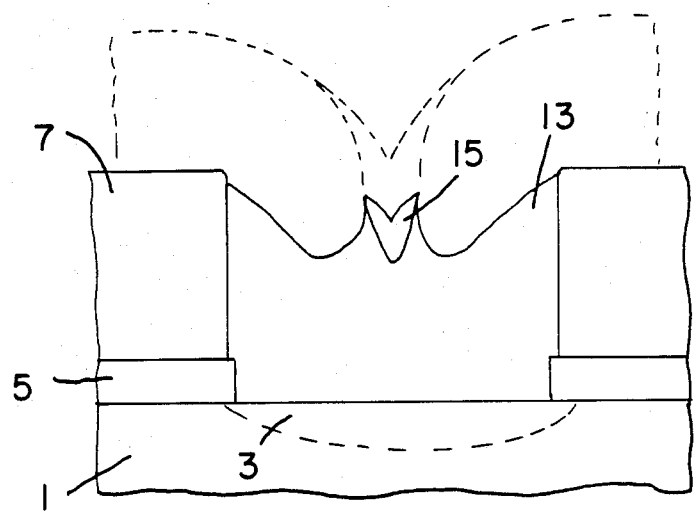

Referring now to FIG. 6, it can be seen that the polycrystalline silicon layer 13 is next etched back using an isotropic polycrystalline silicon plasma etch to remove the polycrystalline silicon that is exposed over the glass layer 7 and, in part, over the aperture. Since the oxide plug 15 etches at a much slower rate than does the polycrystalline silicon, it can be seen that no etch through at the point of the plug will take place down to the silicon substrate 1. It is readily apparent that if the oxide plug 15 were not retained, removal of the portion of the polycrystalline silicon layer 13 over the glass layer 7 could result in removal of sufficient silicon at the region 15 of FIG. 3 to cause etch-through to the substrate itself at that region.

Figure 7:
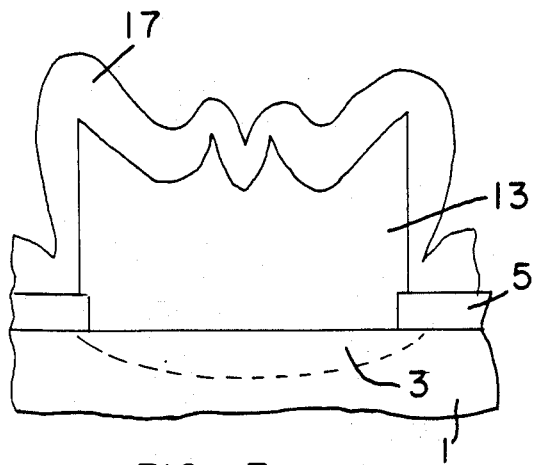
Figure 8:
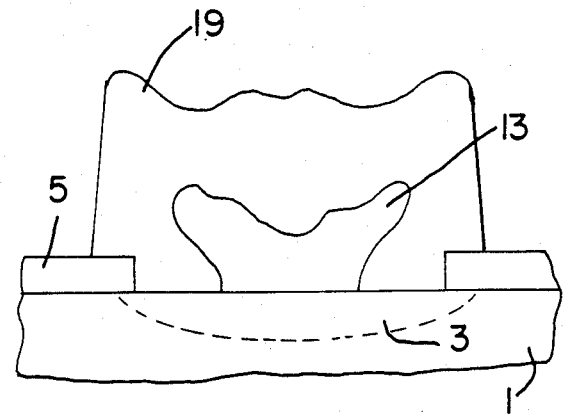

Referring now to FIG. 7, the glass layer 7 and oxide plug 15 are removed using a selective etch such as a very low concentration HF and $HNO_3$ solution (P etch), leaving the silicon oxide layer 5 with the polycrystalline silicon region 13 extending thereabove and contacting the silicon substrate 1 at the active region 3. A titanium metal layer 17 is then deposited over the entire structure using magnetron sputtering or other well known techniques as shown in FIG. 7 and the titanium is then reacted with the silicon with which it comes in contact to form titanium disilicide which extends into most of the polycrystalline silicon layer 13. The titanium disilicide layer 19 is formed by heating for about 45 minutes at 650 degrees C. The resultant structure after the reaction is shown in FIG. 8. The unreacted titanium is then removed using a piranha solution.

It can be seen from FIG. 8 that a conductive contact is formed which extends from the silicon substrate 1 upwardly above all of the then existing layers of the device. Subsequent processing will include formation of other layers of desired material over the oxide layer 5 with subsequent formation of a contact pattern which will also contact the titanium disilicide contact member.

While the disclosure sets forth the use of titanium, it should be understood that other refractory metals can be used, such as, for example, molubdenum or tantalum.

It can be seen from the above structure that there has been provided a contact for a buried layer of a VLSI circuit which is formed prior to the formation of the uppermost layers of the device and which does not suffer the problems encountered due to the small geometry formation of contacts by classical techniques.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of forming a contact for a semiconductor device, comprising the steps of:
   (a) providing a semiconductor substrate;
   (b) forming an insulating layer on said substrate having an aperture therein extending to said substrate;
   (c) depositing a polycrystalline silicon layer in said aperture extending to said substrate and onto said insulating layer, said polycrystalline silicon layer having a depression therein extending into said aperture;
   (d) forming a first oxide layer on said polycrystalline silicon layer, said first oxide layer being thicker in said depression than elsewhere;
   (e) removing said first oxide layer and said polycrystalline silicon layer disposed over said insulating layer, retaining a portion of said first oxide layer in said depression;
   (f) removing said first oxide layer in said depression and a portion of said insulating layer;
   (g) depositing a layer of material taken from the class consisting of titanium, tantalum and molybdenum over said polycrystalline silicon layer; and
   (h) reacting said layer formed in step (g) with the polycrystalline silicon layer therebelow to form a reacted layer.

2. A method as set forth in claim 1 wherein step (b) comprises a second oxide layer on said substrate and a glass layer on said second oxide layer and said portion of said insulating layer removed in step (f) is said glass layer.

3. A method as set forth in claim 1 wherein said reacted layer extends above said substrate and the remaining portion of said insulating layer.

4. A method as set forth in claim 2 wherein said reacted layer extends above said substrate and the remaining portion of said insulating layer.

5. A method as set forth in claim 1 further including the step of forming an additional layer over said substrate, said contact member extending therethrough.

6. A method as set forth in claim 2 further including the step of forming an additional layer over said substrate, said contact member extending therethrough.

7. A method as set forth in claim 3 further including the step of forming an additional layer over said substrate, said contact member extending therethrough.

8. A method as set forth in claim 4 further including the step of forming an additional layer over said substrate, said contact member extending therethrough.

9. A method of forming a contact for a semiconductor device, comprising the steps of:
   (a) providing a semiconductor substrate,
   (b) forming an insulating layer on said substrate having an aperture therethrough extending to said substrate,
   (c) depositing a conformal polycrystalline silicon layer in said aperture and over said insulating layer whereby the polycrystalline layer over said aperture is thicker than over said insulating layer, said polycrystalline silicon layer having a depression therein extending into said aperture;
   (d) forming an etch retarding layer on said polycrystalline silicon layer only over said depression etchable at a rate substantially slower than said polycrystalline silicon layer,
   (e) removing a substantially equal depth of polycrystalline silicon from over said aperture and said insulating layer except beneath said etch retarding layer to leave polycrystalline silicon only in said aperture and along the entire exposed substrate therein, and
   (f) removing said insulating layer.

10. The method of claim 9 wherein, in step (c) the top of said polyscrystalline silicon layer over said aperture extends below the upper surface of said isolating layer.

11. The method of claim 9, further including the step of depositing a layer of material taken from the class consisting of titanium, tantalum and molybdenum over said silicon layer and then reacting said deposited layer of material with said silicon to form a reacted layer.

12. The method of claim 10, further including the step of depositing a layer of material taken from the class consisting of titanium, tantalum and molybdenum over said silicon layer and then reacting said deposited layer of material with said silicon to form a reacted layer.

* * * * *